United States Patent
Liao et al.

(10) Patent No.: US 7,224,619 B2
(45) Date of Patent: May 29, 2007

(54) METHOD AND APPARATUS FOR PROTECTION FROM OVER-ERASING NONVOLATILE MEMORY CELLS

(75) Inventors: Yi Ying Liao, Sijhih (TW); Chih Chieh Yeh, Taipei (TW); Wen Jer Tsai, Hualien (TW); Tao-cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 8 days.

(21) Appl. No.: 11/223,552

(22) Filed: Sep. 9, 2005

(65) Prior Publication Data

US 2007/0058445 A1    Mar. 15, 2007

(51) Int. Cl.
*G11C 16/04*    (2006.01)

(52) U.S. Cl. .......................... 365/185.29; 365/185.24; 365/185.3

(58) Field of Classification Search ........... 365/185.29, 365/185.3, 185.22, 185.24
See application file for complete search history.

(56) References Cited

U.S. PATENT DOCUMENTS

| 5,963,476 | A | 10/1999 | Hung et al. |
| 6,188,604 | B1 | 2/2001 | Liu et al. |
| 6,834,012 | B1 | 12/2004 | He et al. |
| 7,075,828 | B2 * | 7/2006 | Lue et al. ............. 365/185.24 |
| 7,133,313 | B2 * | 11/2006 | Shih ..................... 365/185.18 |
| 2002/0159297 | A1 * | 10/2002 | Yoshida ................ 365/185.28 |
| 2005/0052228 | A1 * | 3/2005 | Yeh et al. .................... 330/10 |
| 2005/0237815 | A1 | 10/2005 | Lue et al. |

OTHER PUBLICATIONS

C.C Yeh et al. "PHINES: A Novel Low Power Program/Erase, Small Pitch, 2-Bit per cell Flash Memory" IEEE 2002, pp. 931-934.

* cited by examiner

*Primary Examiner*—Son Dinh
*Assistant Examiner*—Hien N Nguyen
(74) *Attorney, Agent, or Firm*—Kenta Suzue; Haynes Beffel & Wolfeld LLP

(57) ABSTRACT

Charge trapping memory cells are protected from over-erasing in response to an erase command. For example, in response to an erase command, one bias arrangement is applied to program charge trapping memory cells, and another bias arrangement is applied to erase the charge trapping memory cells, such that the charge trapping memory cells have a higher net electron charge in the erased state than in the programmed state. In another example, an integrated circuit with an array of charge trapping memory cells has logic which responds to an erase command by applying similar bias arrangements to the charge trapping memory cells. In a further example, such an integrated circuit is manufactured.

23 Claims, 12 Drawing Sheets

METHOD AND APPARATUS FOR PROTECTION FROM OVER-ERASING NONVOLATILE MEMORY CELLS

BACKGROUND OF THE INVENTION

1. Field

This technology relates generally to semiconductor devices, and more specifically to nonvolatile memories with program and erase operations.

2. Description of Related Art

Both FIGS. 1A and 1B show a charge-trapping memory cell with a substrate 170, first current-carrying terminal 150, second current-carrying terminal 160, bottom oxide 140, charge-trapping structure 130, top oxide 120, and gate 110. FIGS. 1A and 1B show a charge-trapping memory cell undergoing the establishment of a high threshold state in different parts of the charge-trapping structure. Representative top oxides include silicon dioxide and silicon oxynitride having a thickness of about 50 to 100 Angstroms, or other similar high dielectric constant materials including, for example Al2O3. Representative bottom oxides include silicon dioxide and silicon oxynitride having a thickness of about 30 to 100 Angstroms, or other similar high dielectric constant materials. Representative charge-trapping structures include silicon nitride having a thickness of about 30 to 90 Angstroms, or other similar high dielectric constant materials, including metal oxides such as Al2O3, HfO2, and others. The charge-trapping structure may be a discontinuous set of pockets or particles of charge-trapping material, or a continuous layer as shown in the drawing.

In FIG. 1A, the right part of the charge-trapping structure 130 undergoes a program operation to establish a low threshold state. The voltage of the gate 110 is −5 V. The voltage of the drain 160 is 5 V. The voltage of the source 150 is 0 V. The voltage of the substrate 170 is 0V. Consequently, the right part of the charge-trapping structure 130 has trapped charge 133. In FIG. 1B, the left part of the charge-trapping structure 130 undergoes a program operation to establish a low threshold state. The voltage of the gate 110 is −5 V. The voltage of the drain 160 is 0 V. The voltage of the source 150 is 5 V. The voltage of the substrate 170 is 0 V. Consequently, the left part of the charge-trapping structure 130 has trapped charge 133.

In FIG. 2A, the nonvolatile memory cell undergoes an erase operation. The voltage of the gate 210 is −8 V. The voltage of the drain 260 is 10 V. The voltage of the source 250 is 10 V. The voltage of the substrate 270 is 10 V. Consequently, the electrons move from the gate 210 to the charge trapping structure 230 and from the charge trapping structure 230 towards the substrate 270. In FIG. 2B, the nonvolatile memory cell undergoes an erase operation with reversed voltage polarities. The voltage of the gate 210 is 10 V. The voltage of the drain 260 is −8 V. The voltage of the source 250 is −8 V. The voltage of the substrate 270 is −8 V. Consequently, the electrons move to the gate 210 from the charge trapping structure 230 and to the charge trapping structure 230 from the substrate 270. The erase operation may also be carried out with a floating voltage at the drain 260 and/or the source 250.

FIG. 3 shows an example process flow of erasing a nonvolatile memory cell. In 310, a command to erase the nonvolatile memory cell is received. In 320, in response to the erase command, a biasing arrangement for erasing the nonvolatile memory cell is applied to the terminals of the nonvolatile memory cell. In 330, an erase verify test is performed to confirm that a sufficient amount of erasing has been performed. If the erase verify test fails, then the biasing arrangement for erasing the nonvolatile memory cell is applied again. If the erase verify test passes, then the erase process is successful and done 340.

FIGS. 4A, 4B, and 4C show graphs of the relative distribution of the number of nonvolatile memory cells at various threshold voltages corresponding to the programmed state and erased state. FIG. 4A shows, prior to an erase operation, some nonvolatile memory cells having threshold voltages in the range of 3.5 V to 4 V corresponding to the programmed state 410, and some nonvolatile memory cells having threshold voltages in the range of 5 V to 6 V corresponding to the erased state 420. FIG. 4B shows an erase operation being performed on both the nonvolatile memory cells having threshold voltages corresponding to the programmed state 410 and on the nonvolatile memory cells having threshold voltages corresponding to the erased state 420. As a result, the distribution of the nonvolatile memory cells originally in the programmed state 410 shifts to the erased state 415. Similarly, the distribution of the nonvolatile memory cells originally in the erased state 420 shifts to the erased state 425. FIG. 4C shows the actual distribution of threshold voltages of the nonvolatile memory cells in the erased state after the erase operation, which is the sum of distribution 415 and distribution 425, or distribution 430 in the range of 5 V to 7 V. Because the erase operation shifted not only the threshold voltages of the nonvolatile memory cells in the programmed state 410, but also the threshold voltages of the nonvolatile memory cells in the erased state 420, the result of the program-and-erase cycle is an undesirable wide distribution 430 of threshold voltages of nonvolatile memory cells in the erased state.

Therefore, it would be desirable to perform an erase operation on a nonvolatile memory cell while reducing the tendency of the distribution of threshold voltages of nonvolatile memory cells in the erased state to drift.

SUMMARY OF THE INVENTION

One embodiment is a charge-trapping integrated circuit comprising an array of charge-trapping memory cells and logic coupled to the array. Each charge-trapping memory cell has a charge trapping structure associated with a threshold voltage and a programmed state and an erased state. The value of the threshold voltage determines whether the memory cell is in the programmed state or the erased state. The logic is responsive to a command to erase charge trapping memory cells, by performing several actions. The logic applies a bias arrangement to program charge trapping memory cells whose threshold voltage is outside the programmed state. Then, the logic applies another bias arrangement to establish the erased state in the charge trapping memory cells.

In some embodiments, the charge trapping structure of each charge trapping memory cell takes advantage of the localized charge trapping nature of the charge trapping structure (unlike the uniform charge storage of a floating gate) by associating different charge trapping parts of the charge trapping part structure with a threshold voltage and a programmed state and an erased state. In one embodiment, the logic identifies nonvolatile memory cells of the plurality of charge trapping memory cells having a threshold voltage outside the programmed state, and the programming bias arrangement programs any charge trapping part having a threshold voltage outside the programmed state, and the erasing bias arrangement establishes the erased state in the charge trapping parts. In another embodiment, the programming bias arrangement programs all the charge trapping parts of all the charge trapping memory cells, and the erasing bias arrangement establishes the erased state in all the charge trapping parts of all the charge trapping memory cells In some embodiments, each charge trapping part is associated with not just one erased state and one programmed state, but multiple programmed states. The multiple programmed states include a most programmed state and other, less programmed, states. In one embodiment, the programming bias arrangement programs any charge trapping part having a threshold voltage in either the erased state or any of the less programmed states. In another embodiment, the programming bias arrangement programs all charge trapping parts of all charge trapping memory cells.

In some embodiments, the programming bias arrangement adds holes to the charge trapping structure, and the erasing bias arrangement adds electrons to the charge trapping structure of the plurality of charge trapping memory cells. The holes can be added by band-to-band hot hole conduction. The electrons can be added by tunneling electrons. In other embodiments, the programming bias arrangement adds electrons to the charge trapping structure, and the erasing bias arrangement adds holes to the charge trapping structure.

Various embodiments of erasing nonvolatile memory cells successfully resist a drift in the threshold voltage of nonvolatile memory cells that are repeatedly erased in response to multiple erase commands. For example, after 100 program and erase cycles, the threshold voltage in the erased state of charge trapping memory cells changes by no more than a magnitude of about 0.7 V.

Other aspects of the technology include embodiments directed to a method for performing erasing as described, and a method for manufacturing a nonvolatile memory integrated circuit as described.

DETAILED DESCRIPTION

Figure 1A:
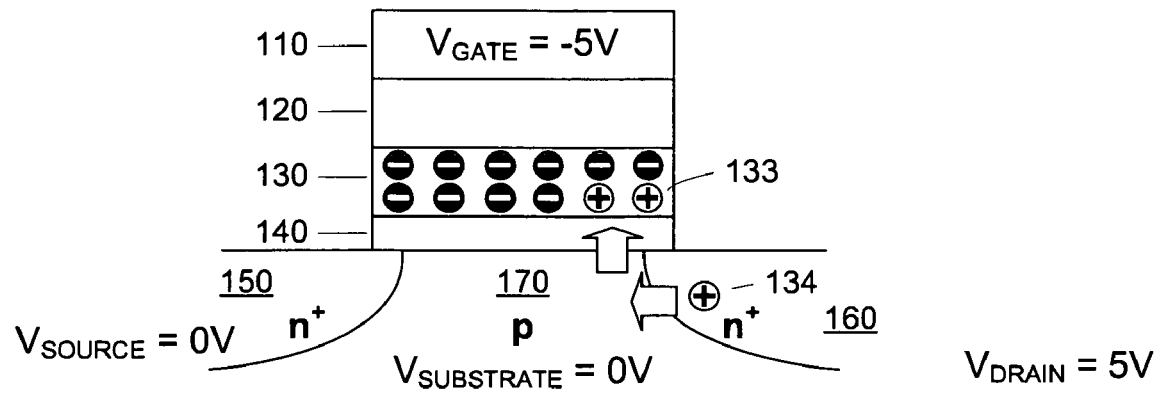
FIGS. 1A and 1B show a charge-trapping memory cell undergoing programming of different parts of the charge-trapping structure.
Figure 1B:
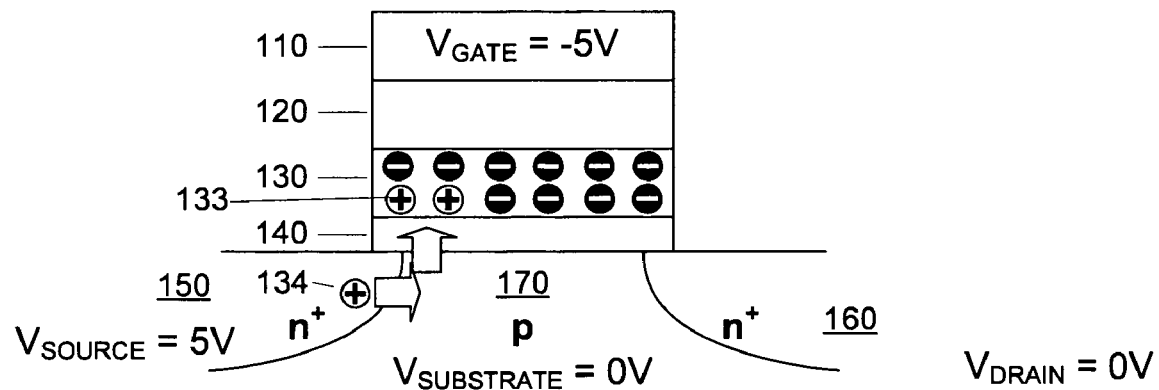
Figure 2A:
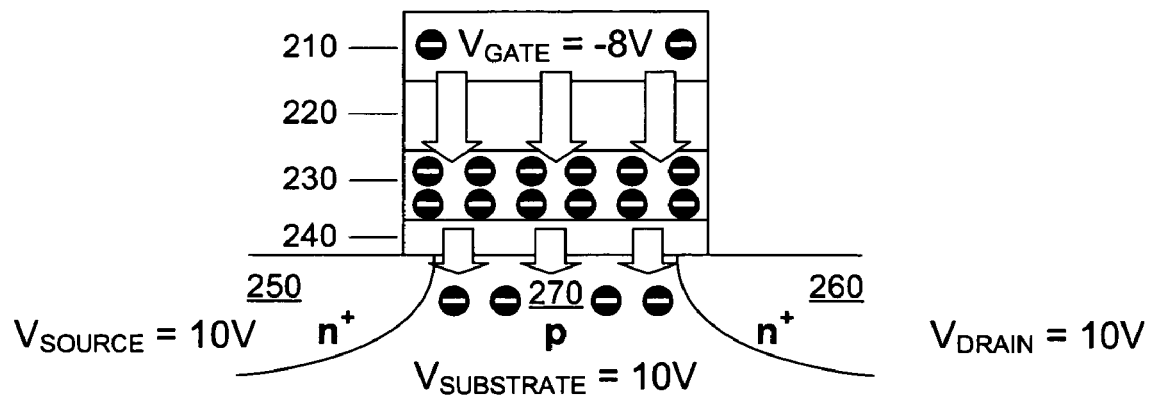
FIGS. 2A and 2B show a charge-trapping memory cell undergoing erasing of different parts of the charge-trapping structure.
Figure 2B:
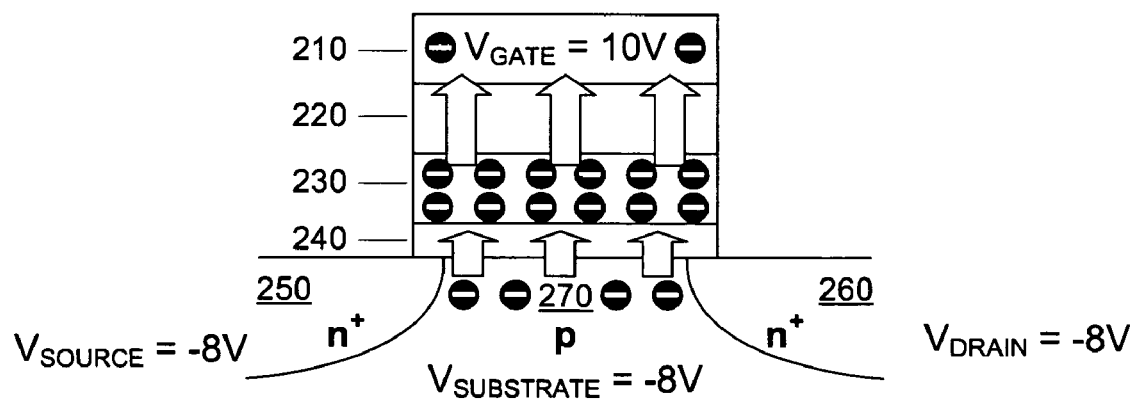
Figure 3:
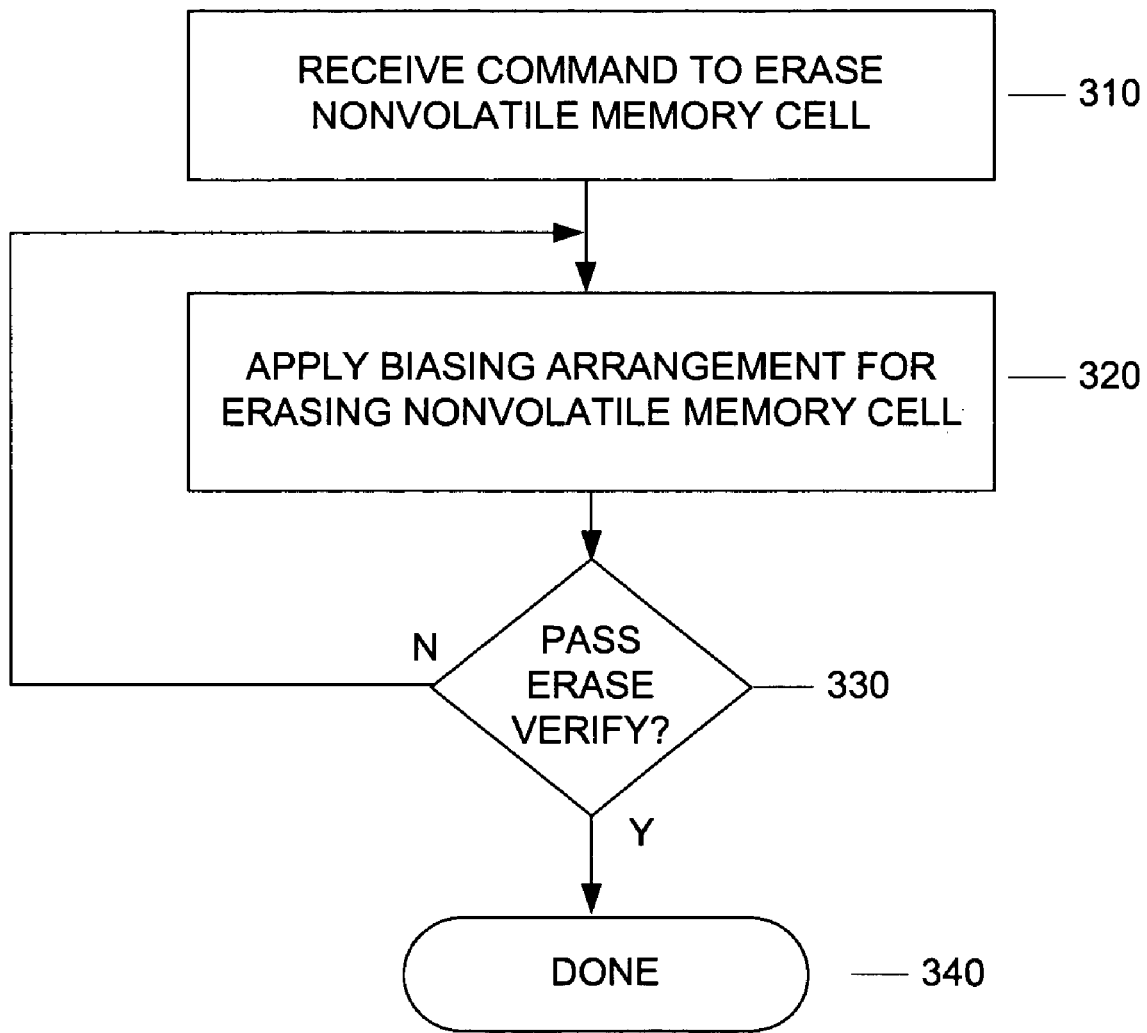
FIG. 3 shows an example process flow of erasing a charge-trapping memory cell without preprogramming.
Figure 4A:
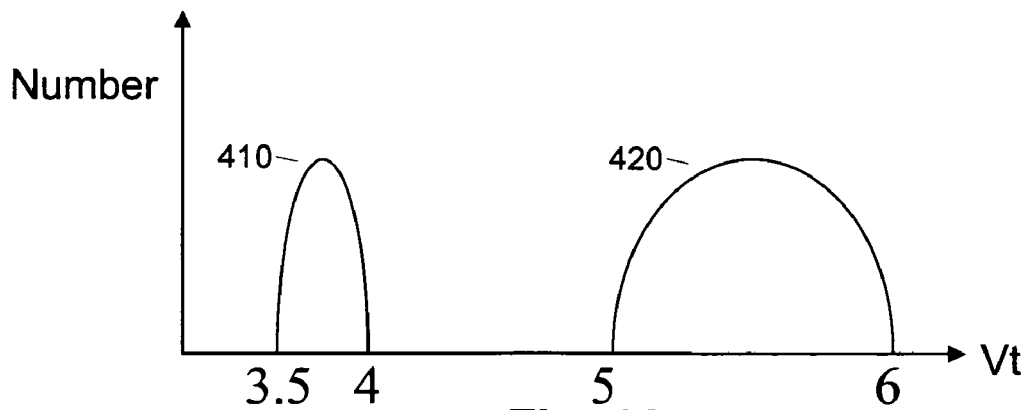
FIGS. 4A, 4B, and 4C show graphs of the relative distribution of the number of charge-trapping memory cells at various threshold voltages corresponding to the programmed state and erased state, during an erase operation without preprogramming.
Figure 4B:
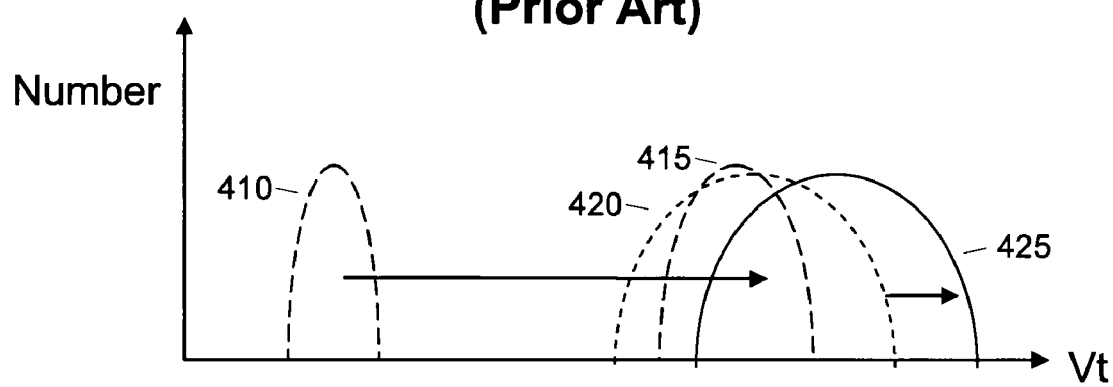
Figure 4C:
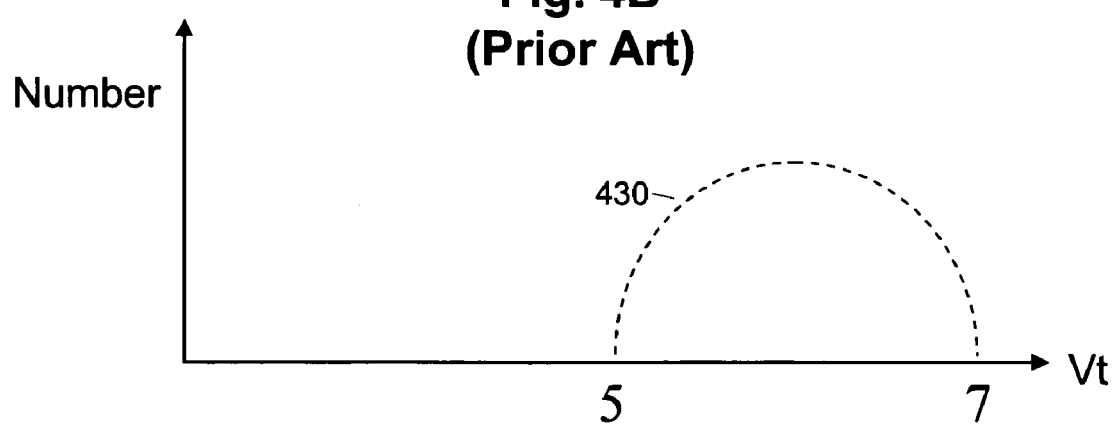
Figure 5:
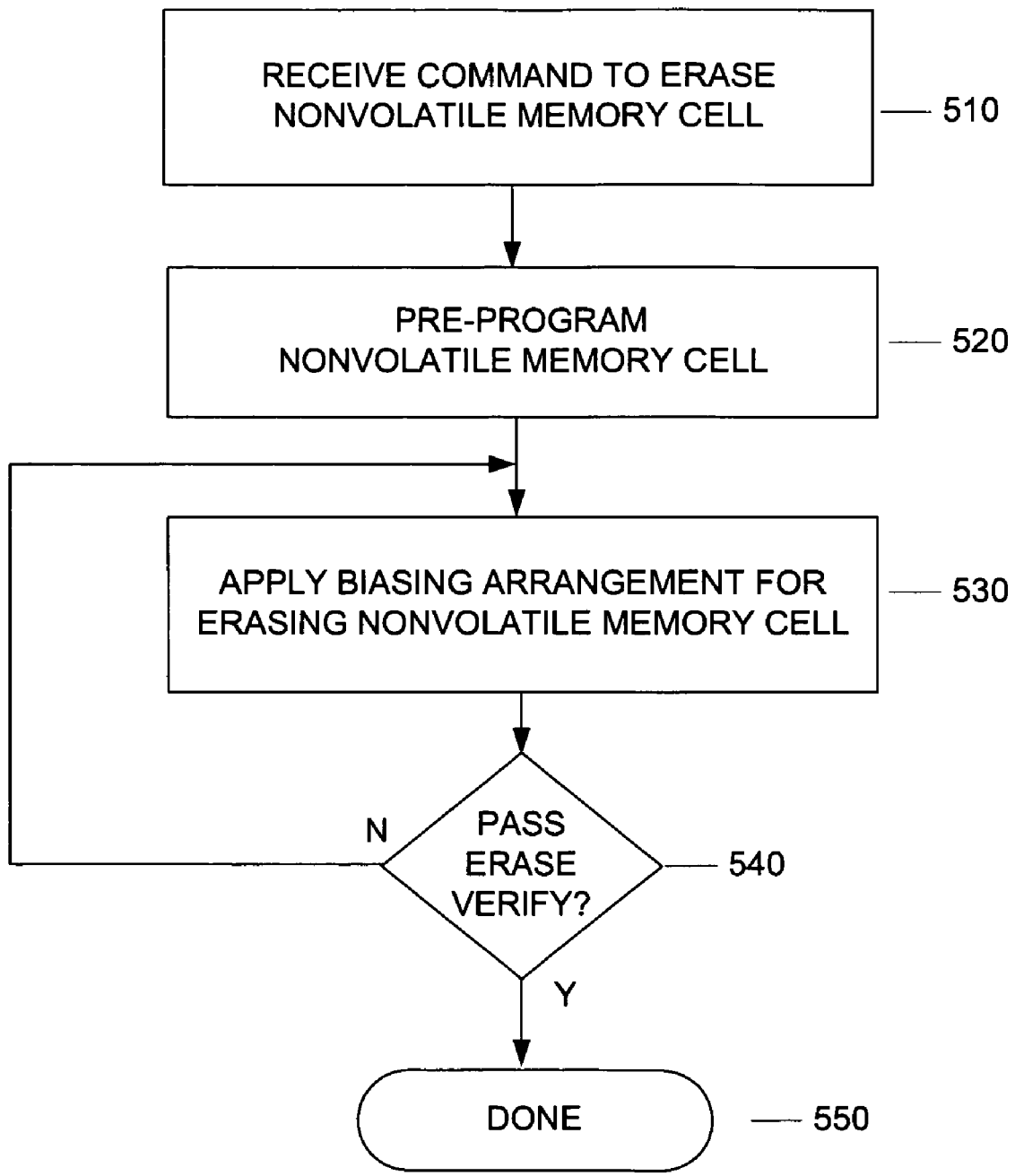
FIG. 5 shows an example process flow of erasing a charge-trapping memory cell with preprogramming.

FIG. 5 shows an example process flow of erasing a nonvolatile memory cell according an embodiment. In 510, a command to erase the nonvolatile memory cell is received. In 520, in response to the erase command, biasing arrangement for programming the nonvolatile memory cell is applied to the terminals of the nonvolatile memory cell. In one embodiment, the biasing arrangement for programming is applied to an entire sector, regardless of which cells in the sector are in the programmed state and which cells are in the erased state. This has the advantage of simplicity, such as decreasing any overhead involved in communication of data about which cells are in the erased state. In another embodiment, the biasing arrangement for programming is applied only to cells which are in the erased state. This avoids the slight shift in the distribution of threshold voltages of nonvolatile memory cells which are already in the programmed state. In 530, after applying the biasing arrangement for programming in response to the erase command, the biasing arrangement for erasing the nonvolatile memory cell is applied to the terminals of the nonvolatile memory cell. In 540, an erase verify test is performed to confirm that a sufficient amount of erasing has been performed. If the erase verify test fails, then the biasing arrangement for erasing the nonvolatile memory cell is applied again. If the erase verify test passes, then the erase process is successful and done 540.

In another embodiment, nonvolatile memory cells having a threshold voltage outside the programmed state are identified. For example, during regular operation, a memory keeping track of the particular state—programmed or erased—is accessed to identify the nonvolatile memory cells having a threshold voltage outside the programmed state. In another example, a read procedure is performed to identify nonvolatile memory cells in the erased state, and/or nonvolatile memory cells nominally in the programmed state but, due to nonideal behavior, have a threshold voltage outside the programmed state. An advantage of identifying nonvolatile memory cells having a threshold voltage outside the programmed state, is that during the erase procedure, rather than programming all the nonvolatile memory cells, some subset of the nonvolatile memory cells may be programmed in order to avoid programming already programmed cells.

Figure 6A:
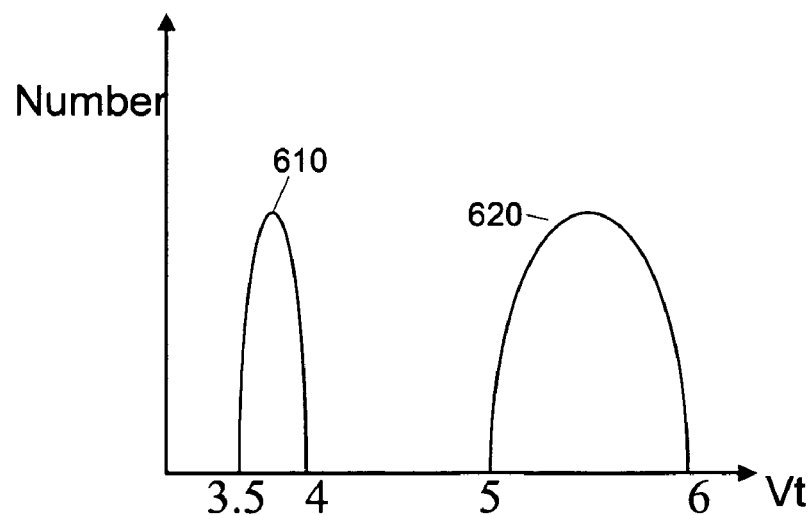
FIGS. 6A, 6B, and 6C show graphs of the relative distribution of the number of charge-trapping memory cells at various threshold voltages corresponding to the programmed state and erased state, during an erase operation with preprogramming.
Figure 6B:
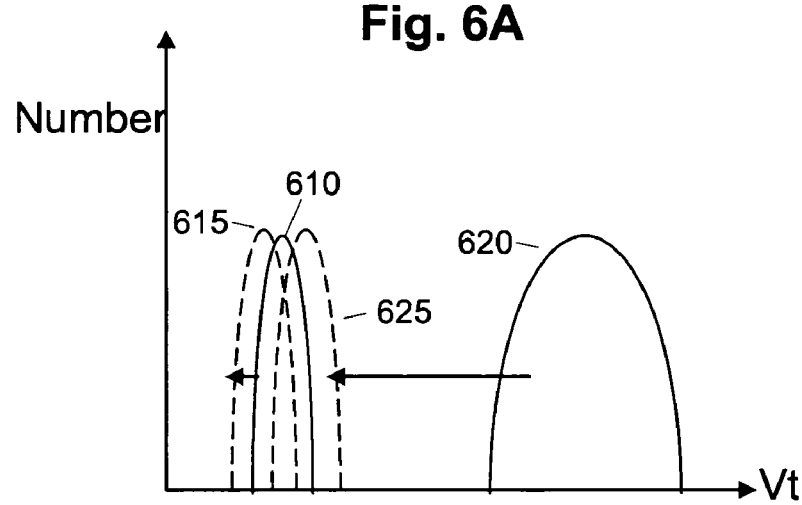
Figure 6C:
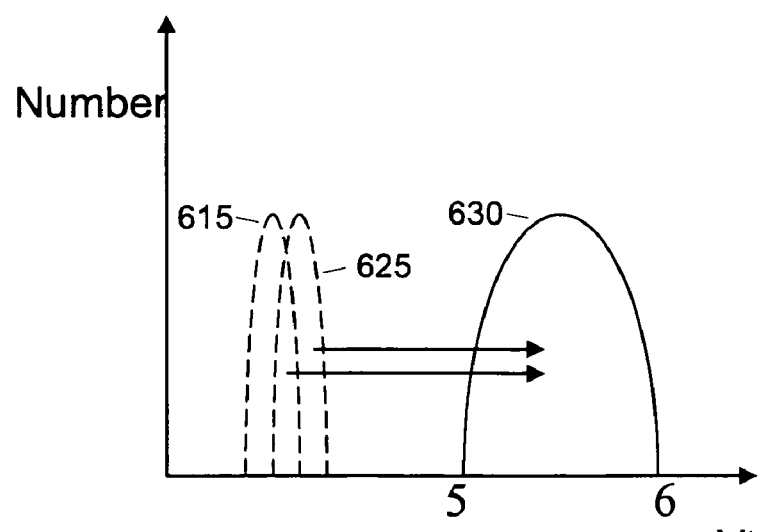

FIGS. 6A, 6B, and 6C show graphs of the relative distribution of the number of nonvolatile memory cells at various threshold voltages corresponding to the programmed state and erased state. FIG. 6A shows, prior to an erase operation, some nonvolatile memory cells having threshold voltages in the range of 3.5 V to 4 V corresponding to the programmed state 610, and some nonvolatile memory cells having threshold voltages in the range of 5 V to 6 V corresponding to the erased state 620. FIG. 6B shows a program operation being performed on both the nonvolatile memory cells having threshold voltages corresponding to the programmed state 610 and on the nonvolatile memory cells having threshold voltages corresponding to the erased state 620. As a result, the distribution of the nonvolatile memory cells originally in the programmed state 610 shifts slightly to the programmed state 615. Similarly, the distribution of the nonvolatile memory cells originally in the erased state 620 shifts to the programmed state 625. FIG. 6C shows an erase operation being performed on both the nonvolatile memory cells having threshold voltages corresponding to the programmed state 615 and on the nonvolatile memory cells having threshold voltages corresponding to the programmed state 625. The distribution of the threshold voltages of nonvolatile memory cells in the erased state after the erase operation is the distribution 630 in the range of 5 V to 6 V, which represents the sum of the threshold voltage distributions of cells in the erased state, from both distribution 615 and 625 after erasing. Because of the prior program operation which shifted the threshold voltages of cells in the erased state to the programmed state, the erase operation did not excessively shift the threshold voltage distribution of nonvolatile memory cells in the erased state.

Figure 7:
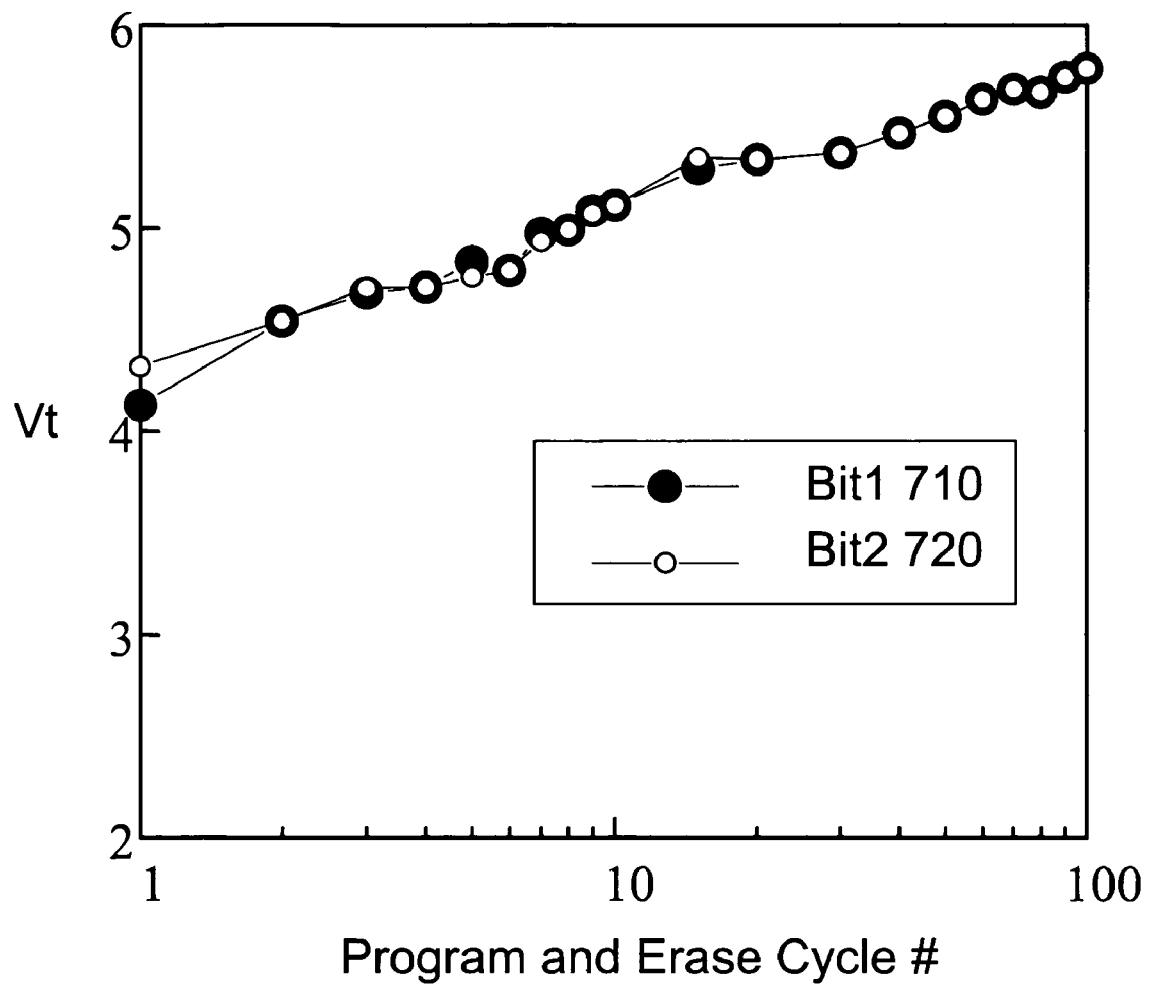
FIG. 7 shows a graph of threshold voltage of a charge-trapping memory cell versus program and erase cycle # for repeated erase operations without preprogramming.

FIG. 7 shows a graph of threshold voltage versus program and erase cycle # for a nonvolatile memory cell with two distinct parts in the charge trapping structure, each capable of holding data independently of the other part. Both bits are repeatedly erased, emulating the situation where both bits of the nonvolatile memory cell are in the erased state, and are not pre-programmed in response to an erase command. Because preprogramming is not performed in response to the erase command, the threshold voltage of bit1 710 drifts upward from about 4 V to nearly 6 V after 100 cycles. The threshold voltage of bit2 720 also drifts upward from about 4.5 V to nearly 6 V after 100 cycles.

Figure 8:
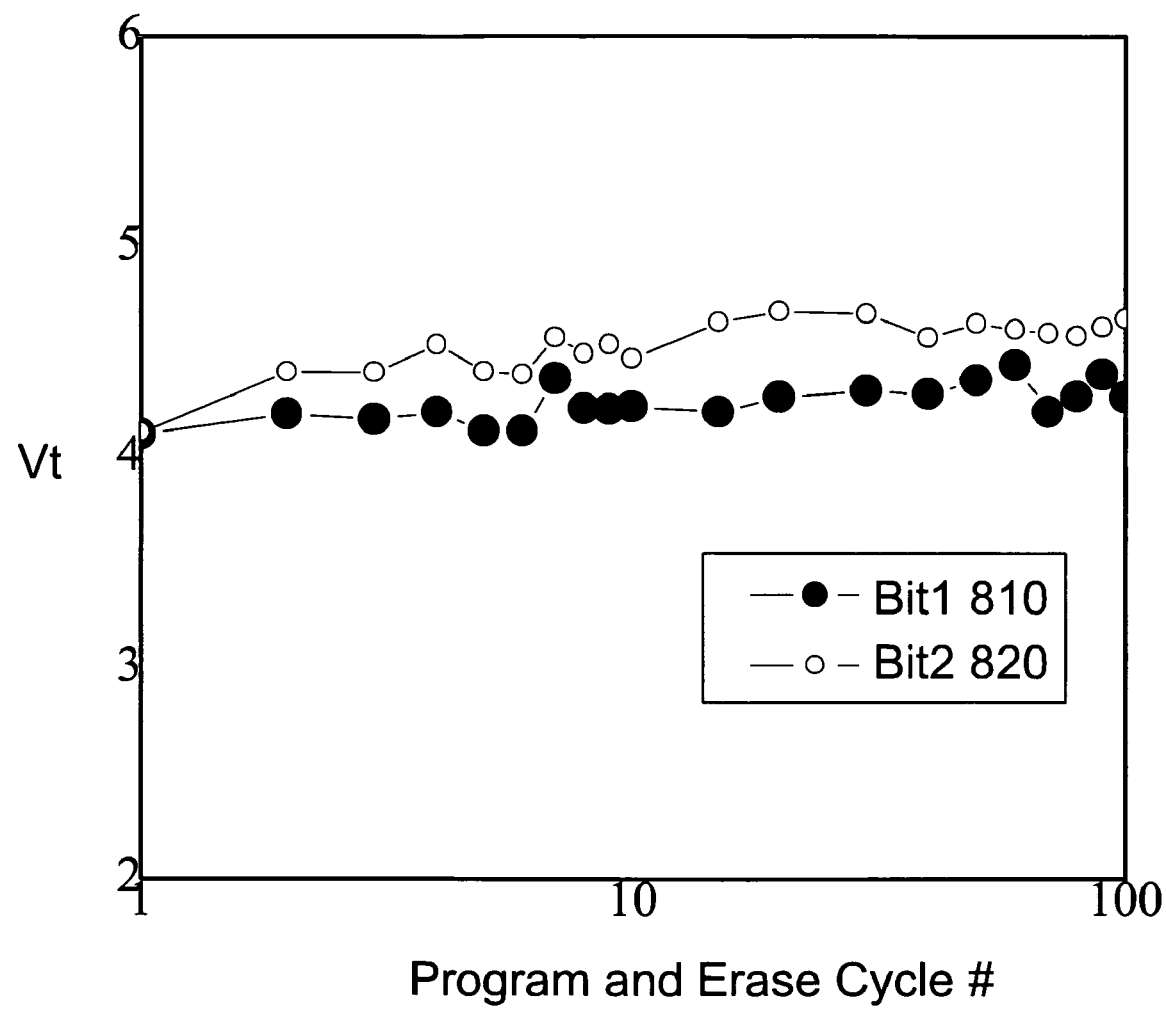
FIG. 8 shows a graph of threshold voltage of a charge-trapping memory cell versus program and erase cycle # for repeated erase operations with preprogramming.

FIG. 8 also shows a graph of threshold voltage versus program and erase cycle # for a nonvolatile memory cell with two distinct parts in the charge trapping structure, each capable of holding data independently of the other part. Both bits are repeatedly erased, emulating the situation where both bits of the nonvolatile memory cell are in the erased state, but first pre-programmed prior to erasing, in response to an erase command. Because preprogramming is performed in response to the erase command, the threshold voltage of bit1 810 drifts upward much less, from about 4 V to slightly over 4 V after 100 cycles. The threshold voltage of bit2 820 also drifts upward much less, from about 4 V to about 4.5 V after 100 cycles.

Figure 9:
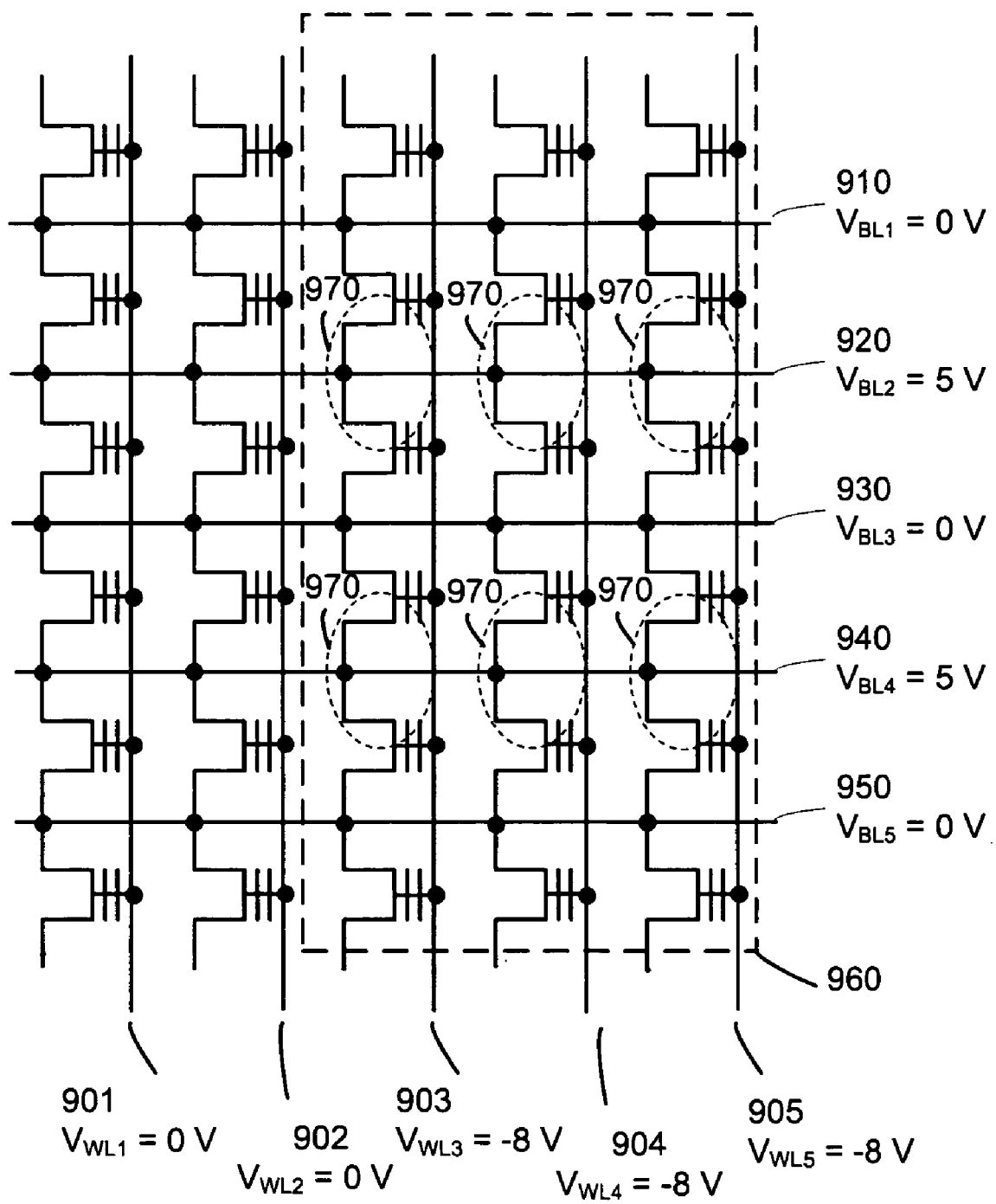
FIG. 9 shows an example of a biasing arrangement for preprogramming an array of charge-trapping memory cells.

FIG. 9 shows an example of a biasing arrangement for preprogramming an array of nonvolatile memory cells. The nonvolatile memory cells are interconnected in a virtual ground array arrangement. The voltages of bit line BL1, $V_{BL1}$ 910; bit line BL3, $V_{BL3}$ 930; and bit line BL5, $V_{BL5}$ 950; are 0 V. The voltages of bit line BL2, $V_{BL2}$ 920; and bit line BL4, $V_{BL4}$ 940; are 5 V. The voltages of word line WL1, $V_{WL1}$ 901; and word line WL2, $V_{WL2}$ 902; are 0 V. The voltages of word line WL3, $V_{WL3}$ 903; word line WL4, $V_{WL4}$ 904; and word line WL5, $V_{WL5}$ 905; are −8 V. By selectively applying voltages to word lines, preprogramming is limited to nonvolatile memory cells in sector 960. By selectively applying voltages to bit lines, preprogramming is limited to the parts of the charge trapping structures indicated by the dashed areas 970. By switching the voltages applied to the bit lines, the remaining parts of the charge trapping structures of nonvolatile memory cells in the sector 960 can be preprogrammed.

Figure 10:
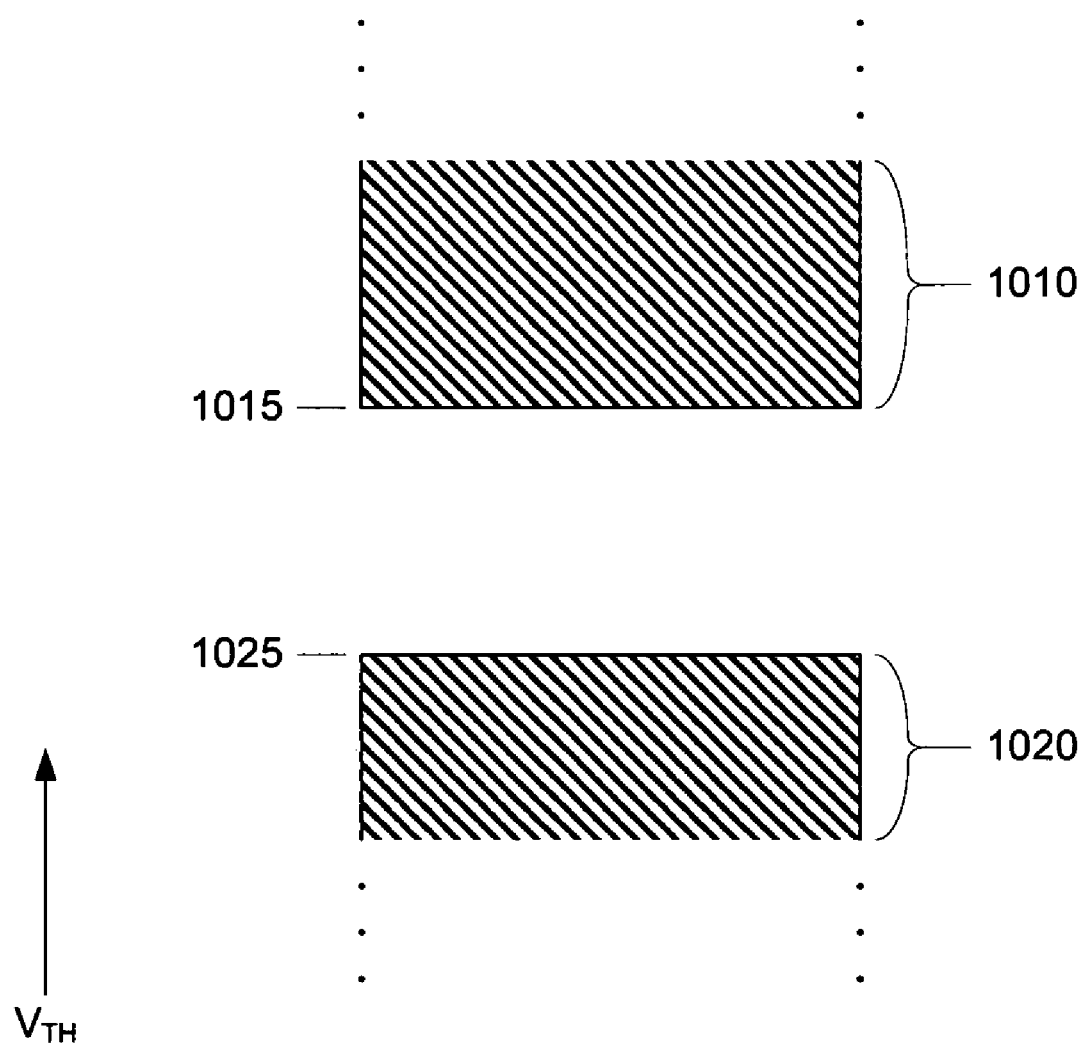
FIG. 10 is a schematic of threshold voltage, indicating two threshold states.

FIG. 10 is a schematic of threshold voltage, indicating two threshold states. High threshold state 1010 is defined by a range of threshold voltages having a minimum threshold voltage of 1015. Low threshold state 1020 is defined by a range of threshold voltages having a maximum threshold voltage of 1025.

In one embodiment, the charge trapping structure has distinct parts which are each associated independently with a threshold state. In another embodiment, a low threshold state 1020 is stored in a charge-trapping memory cell by establishing the low threshold state 1020 in different parts of the charge-trapping structure. The high threshold state 1010 is stored in the charge-trapping memory cell by raising the threshold voltage of one part of the charge-trapping structure into the high threshold state 1010 and raising the threshold voltage of another part of the charge-trapping structure into the high threshold state 1010.

Figure 11A:
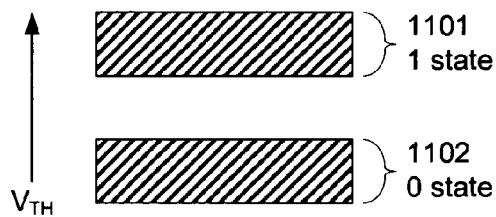
FIG. 11A is a schematic of two-level state operation.
Figure 11B:
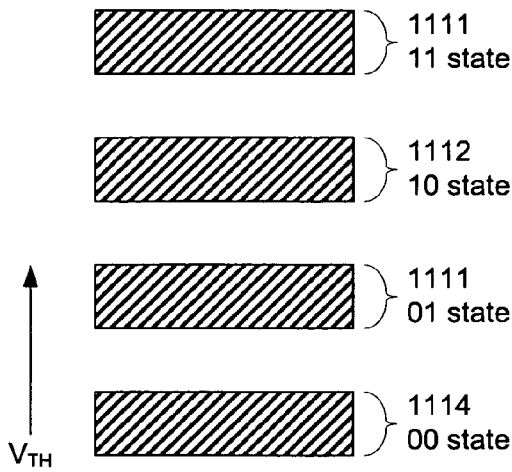
FIGS. 11B, 11C, and 11D are schematics of multi-level threshold states for multi-level cell operation.
Figure 11C:
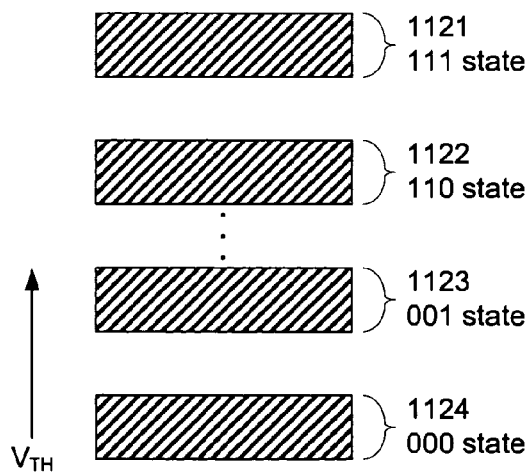
Figure 11D:
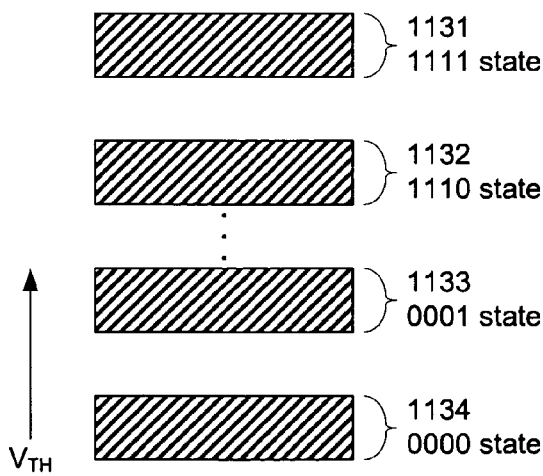

FIGS. 11A, 11B, 11C, and 11D are threshold state schematics corresponding to 1 bit, 2 bits, 3 bits, and 4 bits, respectively. FIG. 11A shows a schematic for two-level threshold state operation. There are two states, the 1 state 1101 and the 0 state 1102. FIG. 11B shows a schematic for four-level threshold state operation. There are 4 states, the 11 state 1111, the 10 state 1112, the 01 state 1111, and the 00 state 1114. FIG. 11C shows a schematic for 8-level threshold state operation. There are 8 states, of which 4 states are shown, the 111 state 1121, the 110 state 1122, the 001 state 1123, and the 000 state 1124. FIG. 11D shows a schematic for 16-level threshold state operation. There are 16 states, of which 4 states are shown, the 1111 state 1131, the 1110 state 1132, the 0001 state 1133, and the 0000 state 1134.

Figure 12:
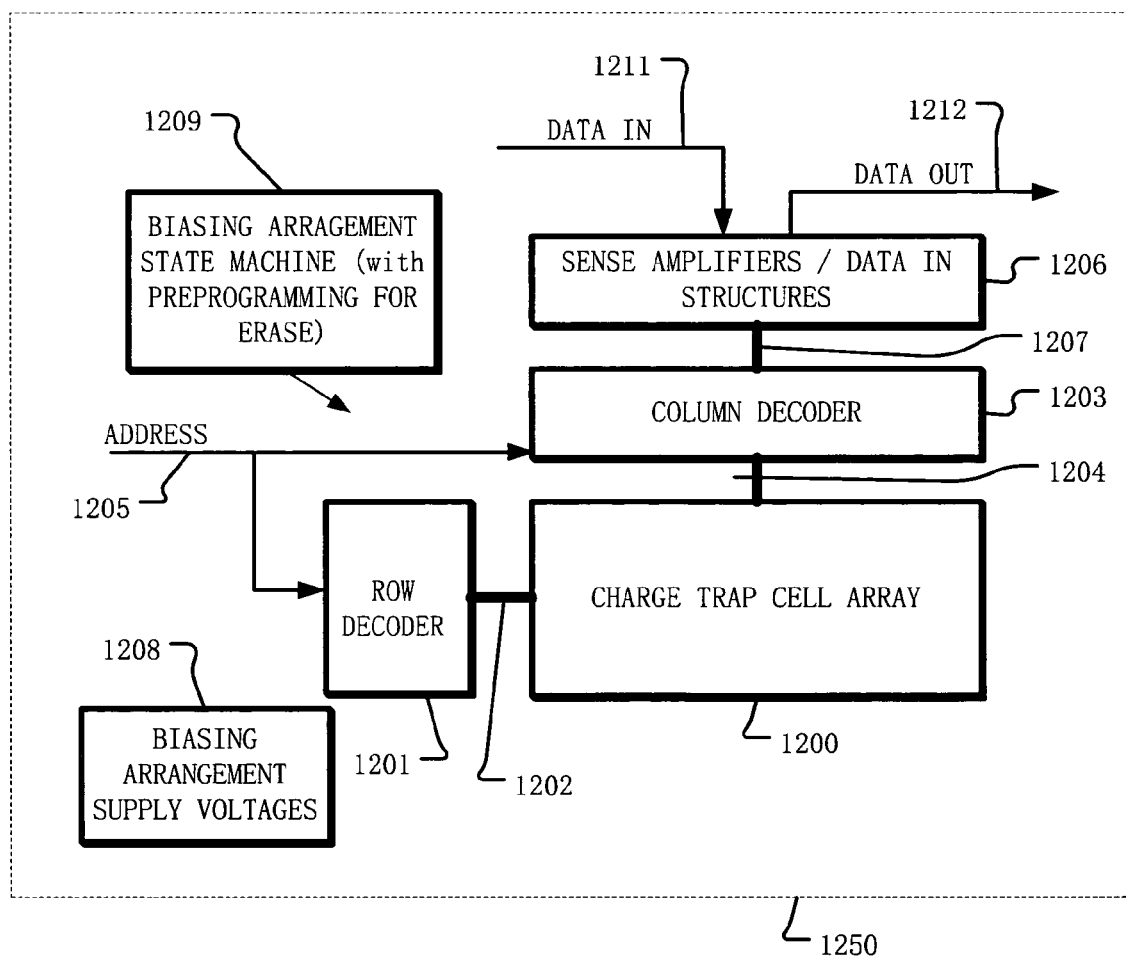
FIG. 12 is a schematic of an integrated circuit embodiment.

FIG. 12 is a simplified block diagram of an integrated circuit according to an embodiment of the present invention. The integrated circuit 1250 includes a memory array 1200 implemented using localized charge-trapping memory cells on a semiconductor substrate. A row decoder 1201 is coupled to a plurality of word lines 1202 arranged along rows in the memory array 1200. A column decoder 1203 is coupled to a plurality of bit lines 1204 arranged along columns in the memory array 1200. Addresses are supplied on bus 1205 to column decoder 1203 and row decoder 1201. Sense amplifiers and data-in structures in block 1206 are coupled to the column decoder 1203 via data bus 1207. Data is supplied via the data-in line 1211 from input/output ports on the integrated circuit 1250, or from other data sources internal or external to the integrated circuit 1250, to the data-in structures in block 1206. Data is supplied via the data-out line 1212 from the sense amplifiers in block 1206 to input/output ports on the integrated circuit 1250, or to other data destinations internal or external to the integrated circuit 1250. A biasing arrangement state machine 1209 controls the application of biasing arrangement supply voltages 1208, such as for the erase verify and program verify voltages, and performing preprogramming in response to a command to erase sectors of the charge-trapping structure of a memory cell.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:
1. A method for erasing charge trapping memory cells, comprising:
in response to a command to erase a plurality of charge trapping memory cells each having a charge trapping structure associated with a threshold voltage, a programmed state, and an erased state:

applying a first bias arrangement to program charge trapping memory cells in the plurality of charge trapping memory cells; and then applying a second bias arrangement to establish the erased state in the plurality of charge trapping memory cells, wherein the charge trapping structure of each charge trapping memory cell of the plurality of charge trapping memory cells has a higher net electron charge in the erased state than in the programmed state.

2. The method of claim 1, further comprising:

identifying charge trapping memory cells of the plurality of charge trapping memory cells having the threshold voltage outside the programmed state, wherein said applying the first bias arrangement programs charge trapping memory cells in said plurality of charge trapping memory cells having the threshold voltage outside the programmed state.

3. The method of claim 1, wherein said applying the first bias arrangement programs all charge trapping memory cells in said plurality of charge trapping memory cells.

4. The method of claim 1, wherein the charge trapping structure of each charge trapping memory cell in the plurality of charge trapping memory cells has a first charge trapping part and a second charge trapping part, each of the first charge trapping part and the second charge trapping part associated with a threshold voltage and a programmed state and an erased state, said applying the first bias arrangement includes applying the first bias arrangement to program any said first charge trapping part and any said second charge trapping having the threshold voltage outside the programmed state; and said applying the second bias arrangement includes applying the second bias arrangement to establish the erased state in the first charge trapping part and the second charge trapping part of each charge trapping memory cell in the plurality of charge trapping memory cells.

5. The method of claim 1, wherein the charge trapping structure of each charge trapping memory cell in the plurality of charge trapping memory cells has a first charge trapping part and a second charge trapping part, each of the first charge trapping part and the second charge trapping part associated with a threshold voltage and a programmed state and an erased state, said applying the first bias arrangement includes applying the first bias arrangement to program the first charge trapping part and the second charge trapping part of each charge trapping memory cell in the plurality of charge trapping memory cells; and said applying the second bias arrangement includes applying the second bias arrangement to establish the erased state in the first charge trapping part and the second charge trapping part of each charge trapping memory cell in the plurality of charge trapping memory cells.

6. The method of claim 1, wherein the charge trapping structure of each charge trapping memory cell in the plurality of charge trapping memory cells has a first charge trapping part and a second charge trapping part, each of the first charge trapping part and the second charge trapping part associated with a threshold voltage and an erased state and a plurality of programmed states, the plurality of programmed states including a most programmed state and a subplurality of less programmed states, said applying the first bias arrangement includes applying the first bias arrangement to program any said first charge trapping part and any said second charge trapping part having the threshold voltage in one of the erased state and any of the subplurality of less programmed states, and said applying the second bias arrangement includes applying the second bias arrangement to establish the erased state in the first charge trapping part and the second charge trapping part of each charge trapping memory cell in the plurality of charge trapping memory cells.

7. The method of claim 1, wherein the charge trapping structure of each charge trapping memory cell in the plurality of charge trapping memory cells has a first charge trapping part and a second charge trapping part, each of the first charge trapping part and the second charge trapping part associated with a threshold voltage and an erased state and a plurality of programmed states, the plurality of programmed states including a most programmed state and a subplurality of less programmed states, said applying the first bias arrangement includes applying the first bias arrangement to program the first charge trapping part and the second charge trapping part of each charge trapping memory cell in the plurality of charge trapping memory cells, and said applying the second bias arrangement includes applying the second bias arrangement to establish the erased state in the first charge trapping part and the second charge trapping part of each charge trapping memory cell in the plurality of charge trapping memory cells.

8. The method of claim 1, wherein said applying the first bias arrangement programs said charge trapping memory cells having the threshold voltage outside the programmed state by adding holes to the charge trapping structure of said charge trapping memory cells, and said applying the second bias arrangement establishes the erased state in the plurality of charge trapping memory cells by adding electrons to the charge trapping structure of the plurality of charge trapping memory cells.

9. The method of claim 1, wherein said applying the first bias arrangement programs said charge trapping memory cells having the threshold voltage outside the programmed state by adding band-to-band hot holes to the charge trapping structure of said charge trapping memory cells, and said applying the second bias arrangement establishes the erased state in the plurality of charge trapping memory cells by tunneling electrons to the charge trapping structure of the plurality of charge trapping memory cells.

10. The method of claim 1, wherein said applying the first bias arrangement programs said charge trapping memory cells having the threshold voltage outside the programmed state by adding electrons to the charge trapping structure of said charge trapping memory cells, and said applying the second bias arrangement establishes the erased state in the plurality of charge trapping memory cells by adding holes to the charge trapping structure of the plurality of charge trapping memory cells.

11. The method of claim 1, wherein after 100 program and erase cycles, the threshold voltage in the erased state of charge trapping memory cells in the plurality of charge trapping memory cells changes by no more than a magnitude of about 0.7 V.

12. A charge-trapping integrated circuit, comprising:

an array of charge-trapping memory cells each having a charge trapping structure associated with a threshold voltage and a programmed state and an erased state; and logic coupled to the array, said logic responsive to a command to erase a plurality of charge trapping memory cells in the array by performing:

applying a first bias arrangement to program charge trapping memory cells in the plurality of charge trapping memory cells having the threshold voltage outside the programmed state; and then applying a second bias arrangement to establish the erased state in the plurality of charge trapping memory cells, wherein the charge trapping structure of each charge trapping memory cell of the plurality of charge trapping memory cells has a higher net electron charge in the erased state than in the programmed state.

13. The circuit of claim 12, wherein said applying the first bias arrangement programs charge trapping memory cells in said plurality of charge trapping memory cells having the threshold voltage outside the programmed state.

14. The circuit of claim 12, wherein said applying the first bias arrangement programs all charge trapping memory cells in said plurality of charge trapping memory cells.

15. The circuit of claim 12, wherein the charge trapping structure of each charge trapping memory cell in the array of charge trapping memory cells has a first charge trapping part and a second charge trapping part, each of the first charge trapping part and the second charge trapping part associated with a threshold voltage and a programmed state and an erased state, said applying the first bias arrangement includes applying the first bias arrangement to program any said first charge trapping part and any said second charge trapping having the threshold voltage outside the programmed state; and said applying the second bias arrangement includes applying the second bias arrangement to establish the erased state in the first charge trapping part and the second charge trapping part of each charge trapping memory cell in the plurality of charge trapping memory cells.

16. The circuit of claim 12, wherein the charge trapping structure of each charge trapping memory cell in the array of charge trapping memory cells has a first charge trapping part and a second charge trapping part, each of the first charge trapping part and the second charge trapping part associated with a threshold voltage and a programmed state and an erased state, said applying the first bias arrangement includes applying the first bias arrangement to program the first charge trapping part and the second charge trapping part of each charge trapping memory cell in the plurality of charge trapping memory cells; and said applying the second bias arrangement includes applying the second bias arrangement to establish the erased state in the first charge trapping part and the second charge trapping part of each charge trapping memory cell in the plurality of charge trapping memory cells.

17. The circuit of claim 12, wherein the charge trapping structure of each charge trapping memory cell in the array of charge trapping memory cells has a first charge trapping part and a second charge trapping part, each of the first charge trapping part and the second charge trapping part associated with a threshold voltage and an erased state and a plurality of programmed states, the plurality of programmed states including a most programmed state and a subplurality of less programmed states, said applying the first bias arrangement includes applying the first bias arrangement to program any said first charge trapping part and any said second charge trapping part having the threshold voltage in one of the erased state and any of the subplurality of less programmed states, and said applying the second bias arrangement includes applying the second bias arrangement to establish the erased state in the first charge trapping part and the second charge trapping part of each charge trapping memory cell in the plurality of charge trapping memory cells.

18. The circuit of claim 12, wherein the charge trapping structure of each charge trapping memory cell in the array of charge trapping memory cells has a first charge trapping part and a second charge trapping part, each of the first charge trapping part and the second charge trapping part associated with a threshold voltage and an erased state and a plurality of programmed states, the plurality of programmed states including a most programmed state and a subplurality of less programmed states, said applying the first bias arrangement includes applying the first bias arrangement to program the first charge trapping part and the second charge trapping part of each charge trapping memory cell in the plurality of charge trapping memory cells, and said applying the second bias arrangement includes applying the second bias arrangement to establish the erased state in the first charge trapping part and the second charge trapping part of each charge trapping memory cell in the plurality of charge trapping memory cells.

19. The circuit of claim 12, wherein said applying the first bias arrangement programs said charge trapping memory cells having the threshold voltage outside the programmed state by adding holes to the charge trapping structure of said charge trapping memory cells, and said applying the second bias arrangement establishes the erased state in the plurality of charge trapping memory cells by adding electrons to the charge trapping structure of the plurality of charge trapping memory cells.

20. The circuit of claim 12, wherein said applying the first bias arrangement programs said charge trapping memory cells having the threshold voltage outside the programmed state by adding band-to-band hot holes to the charge trapping structure of said charge trapping memory cells, and said applying the second bias arrangement establishes the erased state in the plurality of charge trapping memory cells by tunneling electrons to the charge trapping structure of the plurality of charge trapping memory cells.

21. The circuit of claim 12, wherein said applying the first bias arrangement programs said charge trapping memory cells having the threshold voltage outside the programmed state by adding electrons to the charge trapping structure of said charge trapping memory cells, and said applying the second bias arrangement establishes the erased state in the plurality of charge trapping memory cells by adding holes to the charge trapping structure of the plurality of charge trapping memory cells.

22. The circuit of claim 12, wherein after 100 program and erase cycles, the threshold voltage in the erased state of charge trapping memory cells in the plurality of charge trapping memory cells changes by no more than a magnitude of about 0.7 V.

23. A method of manufacturing a charge-trapping integrated circuit, comprising:

making an array of charge-trapping memory cells each having a charge trapping structure associated with a threshold voltage and a programmed state and an erased state; and coupling logic to the array, said logic responsive to a command to erase a plurality of charge trapping memory cells in the array by performing:

applying a first bias arrangement to program charge trapping memory cells in the plurality of charge trapping memory cells having the threshold voltage outside the programmed state; and then applying a second bias arrangement to establish the erased state in the plurality of charge trapping memory cells, wherein the charge trapping structure of each charge trapping memory cell of the plurality of charge trapping memory cells has a higher net electron charge in the erased state than in the programmed state.

* * * * *

UNITED STATES PATENT AND TRADEMARK OFFICE
CERTIFICATE OF CORRECTION

| | | |
|---|---|---|
| PATENT NO. | : 7,224,619 B2 | Page 1 of 1 |
| APPLICATION NO. | : 11/223552 | |
| DATED | : May 29, 2007 | |
| INVENTOR(S) | : Yi Ying Liao et al. | |

It is certified that error appears in the above-identified patent and that said Letters Patent is hereby corrected as shown below:

In claim 15, column 9, line 32, before the word "having" insert -- part --.

Signed and Sealed this

Twenty-seventh Day of November, 2007

JON W. DUDAS
*Director of the United States Patent and Trademark Office*